United States Patent
Frey et al.

(10) Patent No.: US 7,126,204 B2
(45) Date of Patent: Oct. 24, 2006

(54) INTEGRATED SEMICONDUCTOR CIRCUIT WITH AN ELECTRICALLY PROGRAMMABLE SWITCHING ELEMENT

(75) Inventors: Ulrich Frey, Dresden (DE); Andreas Felber, Dresden (DE); Jürgen Lindolf, Friedberg (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 10/886,017

(22) Filed: Jul. 7, 2004

(65) Prior Publication Data

US 2005/0073024 A1   Apr. 7, 2005

(30) Foreign Application Priority Data

Jul. 16, 2003   (DE) ............... 103 32 312

(51) Int. Cl.
*H01L 29/00* (2006.01)
*H01L 29/32* (2006.01)
*H01L 29/74* (2006.01)
*H01L 31/111* (2006.01)
*H01L 29/34* (2006.01)

(52) U.S. Cl. ............ 257/529; 257/107; 257/119; 257/121; 257/130; 257/138; 257/147; 257/355; 257/356; 257/360; 257/530; 257/665

(58) Field of Classification Search ............... 257/107, 257/119, 121, 130, 138, 147, 355, 356, 360, 257/529–530, 665
See application file for complete search history.

(56) References Cited

U.S. PATENT DOCUMENTS

| | | | | |
|---|---|---|---|---|
| 5,158,899 A | * | 10/1992 | Yamagata | 438/529 |
| 5,204,541 A | * | 4/1993 | Smayling et al. | 257/138 |
| 5,663,584 A | * | 9/1997 | Welch | 257/288 |
| 5,932,914 A | * | 8/1999 | Horiguchi | 257/355 |
| 6,054,738 A | * | 4/2000 | Sander et al. | 257/341 |
| 6,392,468 B1 | * | 5/2002 | Wu | 327/525 |
| 6,399,990 B1 | * | 6/2002 | Brennan et al. | 257/355 |
| 6,950,342 B1 | * | 9/2005 | Lindhorst et al. | 365/185.21 |
| 2004/0051162 A1 | | 3/2004 | Chidambarrao et al. | |
| 2004/0212037 A1 | * | 10/2004 | Chen et al. | 257/530 |
| 2004/0217441 A1 | * | 11/2004 | Lehmann et al. | 257/530 |
| 2004/0251502 A1 | * | 12/2004 | Reddy et al. | 257/356 |

* cited by examiner

FOREIGN PATENT DOCUMENTS

DE   103 42 028 A1   3/2004

*Primary Examiner*—Ida M. Soward
(74) *Attorney, Agent, or Firm*—Slater & Matsil, L.L.P.

(57) ABSTRACT

The invention relates to a semiconductor circuit (20) having an electrically programmable switching element (10), an "antifuse", which includes a substrate electrode (2), produced in a substrate (1) which can be electrically biased with a substrate potential (Vo), and an opposing electrode (5) which is isolated from the substrate electrode (2) by an insulating layer (8), where the substrate electrode (2) includes at least one highly doped substrate region (3), and where the opposing electrode (5) can be connected to an external first electrical potential (V+) which can be provided outside of the semiconductor circuit (20). In line with the invention, the substrate electrode (2) can be connected to a second electrical potential (V−), which is provided inside the circuit and which, together with the external first potential (V+), produces a higher programming voltage (V) than the external first potential (V−) together with the substrate potential (Vo). In addition, the substrate electrode (2) is shielded from the substrate potential (Vo) by a current barrier layer (7). This allows the second potential to be lowered below the substrate potential or to be raised above it; the resulting increased programming voltage does not endanger other circuit regions.

20 Claims, 2 Drawing Sheets

INTEGRATED SEMICONDUCTOR CIRCUIT WITH AN ELECTRICALLY PROGRAMMABLE SWITCHING ELEMENT

This application claims priority to German Patent Application 103 32312.0, which was filed Jul. 16, 2003, and is incorporated herein by reference.

TECHNICAL FIELD

The invention relates to an integrated semiconductor circuit having an electrically programmable switching element which can be switched once from an electrically insulating state into an electrically conductive state by applying a programming voltage
- where the switching element has a substrate electrode, produced in a substrate which can be electrically biased with a substrate potential, and an opposing electrode which is isolated from the substrate electrode by an insulating layer,
- where the substrate electrode comprises at least one highly doped substrate region, and
- where the opposing electrode can be connected to an external first electrical potential which can be provided outside of the semiconductor circuit.

BACKGROUND

Such semiconductor circuits are frequently used as memory circuits, particularly for DRAMs (Dynamic Random Access Memories). Semiconductor memories contain a multiplicity of memory cells which can be driven electrically using word lines and bit lines. Frequently, some of the memory cells are inoperable, in which case additional memory cells, provided on the semiconductor chip as a replacement for faulty memory cells, are switched in before the semiconductor memory is put into operation. To this end, by way of example, additional word lines are activated and word lines leading to faulty memory cells are deactivated. Activation or deactivation is effected using electrically programmable fuses which can be switched once from a conductive state into an insulating state (in the case of a fuse) of from an electrically insulating state into an electrically conductive state (in the case of an "antifuse") using an increased programming voltage.

Such redundant circuits are employed to make it possible to use a number of intact memory cells which is sufficient overall. In this case, a word line or bit line which is normally driven is permanently deactivated and a redundant word line or bit line is permanently activated, respectively. In addition, logic circuits may also contain electrically programmable switching elements, e.g. fuses, particularly "antifuses".

Electrical fuses (antifuses and fuses) require higher voltages than the operating voltages of between 1.5 and 4 V, for example 3.3 V, which are usual in semiconductor circuits. In the case of antifuses, for example, an insulating layer needs to be blown, which is why it is necessary for a sufficiently high programming voltage for blowing the insulating layer and hence for switching the antifuse to be applied to two electrodes arranged on either side of this insulating layer.

Electrically switchable fuses are frequently produced using transistor designs, in which case the two source/drain implantations are shorted to form a single electrode at the substrate. For this purpose, they are put into a well which has been doped using dopant of the same doping type (n-doping or p-doping) as the source/drain regions themselves. Also, such a switching element is designed like a transistor; above the gate oxide layer there is the gate electrode, which in this case serves as second electrode of the switching element.

The source/drain implantations are highly doped substrate regions of the substrate electrode; in addition, there may optionally be another channel doping, likewise of the same doping type, in order to enrich charge carriers centrally beneath the gate layer more easily, said charge carriers traversing the insulating layer and destroying it locally when the programming voltage is applied, which makes the switching element permanently conductive.

In the case of a p-doped semiconductor substrate, for example, an electrically switchable switching element such as an nFET (n-field effect transistor) is produced, whose source/drain implantations are negatively doped. This transistor structure is produced in an n-well made in the p-substrate, so that the two heavily n-doped source/drain implantations are shorted by the likewise n-doped well. This means that the use of a well of the same doping type as the doping type of the two source/drain implantations conventionally permits these implantations to be shorted to form a single substrate electrode on the switching element.

In the case of a p-substrate, the gate electrode is connected to an external positive potential (i.e. one which is provided outside of the semiconductor substrate) when the switching element is to be blown. The substrate electrode formed using the shorted source/drain implantations is connected to a second potential, which is provided by the semiconductor circuit itself; if it is large enough, the potential difference between the two potentials results in the gate oxide layer melting through. In the case of the p-substrate which contains the n-doped well for the switching element in an nFET design, the second potential chosen in order to bias the substrate electrode is one which is higher than the substrate potential, i.e. higher than 0 V, in order to maintain a reverse biased pn-junction between the well and the surrounding substrate when the switching element is blown. Otherwise, the charges intended for blowing the switching element would drain via the substrate.

The potential connected to the substrate electrode is thus (in the case of a p-substrate) always positive. Since electrons need to be accumulated in the channel region of the switching element, the gate potential for blowing the switching element is higher by the programming voltage than the potential on the substrate electrode.

When the potential on the substrate electrode is already positive anyway, the condition of high programming voltages results in a very large value for the potential on the gate electrode; if such a high potential is applied to the gate electrode from an external connection via the semiconductor circuit, other regions of the semiconductor circuit which cannot withstand such high voltages are destroyed. Hence, limits are set for the level of programming voltages which can be applied in the conventional design of electrical fuses or antifuses.

SUMMARY

It is an object of the present invention to provide a semiconductor circuit having an electrically programmable switching element which can be programmed in the conventionally possible manner without damaging the semiconductor circuit at relatively high programming voltages.

The invention achieves this object by means of an integrated semiconductor circuit having an electrically programmable switching element that can be switched once from an electrically insulting state into an electrically conductive state by applying a programming voltage, in which additionally the substrate electrode can be connected, for the purpose of programming the switching element, to a second electrical potential, which is provided by the semiconductor circuit and which, together with the external first potential, provides a higher programming voltage than the external first potential together with the substrate potential, and in which the substrate electrode is shielded from the substrate potential by a current barrier layer which, when the switching element is programmed, prevents a flow of current between the substrate electrode and a region of the substrate which has been biased with the substrate potential.

In line with the invention, the substrate electrode and the remainder of the semiconductor substrate have a current barrier layer between them which prevents a flow of current between the two, at least when the surrounding substrate has been biased with the substrate potential, as is usual during operation. In addition, the substrate electrode can be biased with a second electrical potential of the type which, for a prescribed external potential, for example +3 V, results in a higher programming voltage than the difference between the external potential and the substrate potential. In the case of a p-substrate which has been biased to 0 V, for example, it is therefore possible for the first time to apply a negative potential to the substrate electrode which, together with the external positive potential for the opposing electrode (in an MOS design a gate electrode), results in a very much higher programming voltage. The inventive combination of the opposite bias for the substrate electrode and the substrate shielding using the current barrier layer permits the substrate electrode potential and the substrate potential to be decoupled. The resultant higher programming voltage does not require a higher potential for the opposing electrode; the external potential does not need to be increased, which means that the remainder of the regions of the semiconductor circuit are not destroyed by programming the switching element.

Preferably, the current barrier layer is a doped intermediate layer which has the opposite doping from that of the substrate which surrounds the intermediate layer. If the substrate is p-doped, for example, than the current barrier, i.e. the doped intermediate layer, is n-doped, and vice versa. The inventive opposite doping in combination with the chosen levels for the substrate potential and the substrate electrode potential allow the formation of a blocking pn-junction between the current barrier layer and the substrate, which prevents leakage currents when the switching element is programmed. As a result, the necessary programming voltage is maintained and is dissipated exclusively across the switching element itself, i.e. its insulating layer.

Preferably, provision is made for the substrate electrode to comprise a weakly doped substrate region which surrounds the highly doped substrate region and which likewise has the opposite doping from that of the current barrier layer. In particular, provision is made for the weakly doped substrate region which is immediately adjacent to the highly doped substrate region to have the opposite doping from that of the latter too. This means that it is not only possible to use n-FET antifuses in n-wells on a p-substrate, as is conventional, but also n-FET antifuses in p-wells. A possibly blocking pn-junction between the highly doped region and the weakly doped region of the substrate electrode is nullified by a short circuit between the two regions; such a short circuit may be, by way example, the simultaneous contact made between the highly doped region and the weakly doped region by two contacts shorted to one another in an interconnect plane. The weakly doped region used may also be a p-doped well which, in combination with an n-doped current barrier layer, additionally delivers a second reverse biased pn-junction and hence twice the level of insulation between the substrate electrode and the semiconductor substrate.

In terms of the boundary between the highly doped substrate region and the weakly doped substrate region, the junction is fluid; it is obtained naturally in the conventional MOSFET design, in which, for the purposes of the present invention, the source/drain implantations are highly doped and the substrate situated between them is weakly doped, at least beneath the channel region. The dopant concentrations of a highly doped region may be higher than $1 \times 10^{19}/cm^3$, for example, and those of a weakly doped region may be lower than $1 \times 10^{18}/cm^3$. In any case, the highly doped region is more strongly or more highly doped than the weakly doped region.

Preferably, provision is made for the current barrier layer to be able to be connected to a blocking potential for the purposes of programming the switching element, which results in reverse biased pn-junctions between the current barrier layer and the substrate and between the current barrier layer and the substrate electrode. The electrical connection between the current barrier layer and a suitably chosen blocking potential ensures electrical insulation between the substrate electrode and the surrounding substrate and allows the electrical potential of the substrate electrode to be changed independently of the substrate potential. The current barrier layer may have been connected to the blocking potential either permanently or just during the programming operation for the switching element.

Preferably, provision is made for the highly doped substrate region of the substrate electrode and the doped intermediate layer to be n-doped, for a region of the substrate which can be biased with the substrate potential and the weakly doped substrate region to the p-doped, and for the blocking potential to be higher than the substrate potential.

Alternatively, provision may be made for the highly doped substrate region of the substrate electrode and the doped intermediate layer to be p-doped, for a region of the substrate which can be biased with the substrate potential and the weakly doped substrate region to be n-doped, for the blocking potential to be lower than the substrate potential.

In line with one alternative embodiment, the current barrier layer is an electrical insulating layer. It may be produced in the same way as STI (shallow trench isolation) trench fillings, in which case there needs to be insulation from the substrate beneath the substrate electrode too, however. In principle, it is possible to use any insulating materials for the insulating layer, for example nitrides or oxides.

In one preferred embodiment, the current barrier layer comprises a buried layer beneath the weakly doped substrate region and comprises side insulations which surround the switching element at the sides and extend as far as the buried layer. The substrate electrode insulated from the substrate on all sides in this manner can then be biased with an arbitrarily negative (or positive) potential in order to program the switching element, without the need for the semiconductor circuit to provide and maintain an additional potential for the current barrier layer itself.

Preferably, provision is made for the opposing electrode to be a gate electrode which is isolated from the substrate electrode by a gate oxide layer. In particular, provision is made for the highly doped region of the substrate electrode to comprise two source/drain implantations which are shorted to one another.

In one development, provision is made for a channel doping of the same doping type as that of the source/drain implantations to be introduced into the substrate between the two source/drain implantations. The channel doping which has been introduced permanently between the two source/drain implantations offset at the side of the gate electrode makes it easier to blow an antifuse, since there is always a high concentration of charge carriers in the region of the base area of the gate oxide layer, even without biasing one source/drain implantation with respect to the other (which is not possible in the case of an antifuse), and this high concentration of charge carriers destroys the gate oxide layer all the more easily when the programming voltage is applied.

In one development, the semiconductor circuit has a plurality of switching elements which are shielded from the substrate region which can be biased with the substrate potential by a common current barrier layer and whose substrate electrodes are shorted to one another and whose opposing electrodes are shorted to one another. Arranging a multiplicity of antifuses in MOSFET design in a single surrounding current barrier layer has the advantage that beneath that gate electrode at which the highest concentration of charge carriers and the largest voltage spike form locally, further charge carriers in the remaining antifuses quickly gather and, as a result, cause the gate oxide to be blown much more quickly and reliably. To switch or program the entire switching element structure, it is sufficient for a single antifuse structure to be blown.

The inventive semiconductor circuit is preferably a memory circuit, particularly a memory circuit in a dynamic read/write memory.

Otherwise, the inventive semiconductor circuit may be any other circuit, for example a logic circuit without a memory area, an embedded DRAM or a nonvolatile semiconductor memory.

BRIEF DESCRIPTION OF THE DRAWINGS

The invention is described below with reference to the figures, in which:

FIG. 1 shows a semiconductor circuit 20 based on the invention, with a switching element 10 in the as yet unprogrammed state being shown in its substrate 1, a p-substrate. The switching element 10 is an antifuse, i.e. a fuse element which in the normal state is electrically insulating, i.e. is switched off. The switching element 10 is produced in a transistor design and has a gate electrode 5, arranged on a gate oxide layer 8, as the opposing electrode to a substrate electrode 2 which is formed by two source/drain implantations 3; 3a, 3b and the substrate region situated in between. The two source/drain implantations are shorted to one another, for example using an electrical circuit 12 which is arranged above the substrate surface 14 and supplies a negative potential, used in line with the invention, as a second potential to achieve a sufficiently high programming voltage. A switch 13 allows this voltage V to be applied temporarily to the substrate electrode 2. Unlike conventional antifuses, the substrate electrode 2 can have a weakly doped region 6 of opposite doping type, said doping type p being opposite to the doping type n of the source/drain implantations 3. To connect this weakly doped region 6, a further highly n-doped implantation 3c, shown separated by a Shallow Trench Isolation (STI) region 15, may be provided.

Since the highly n-doped implantations shorted to one another on both sides of the gate oxide layer do not automatically result in the production of a channel, i.e. a highly concentrated gathering of negative charge carriers, beneath the base area of the gate oxide layer or the gate electrode 5, it is additionally possible to introduce a channel doping 4 which makes it easier for the programming voltage to break through.

Figure 1:
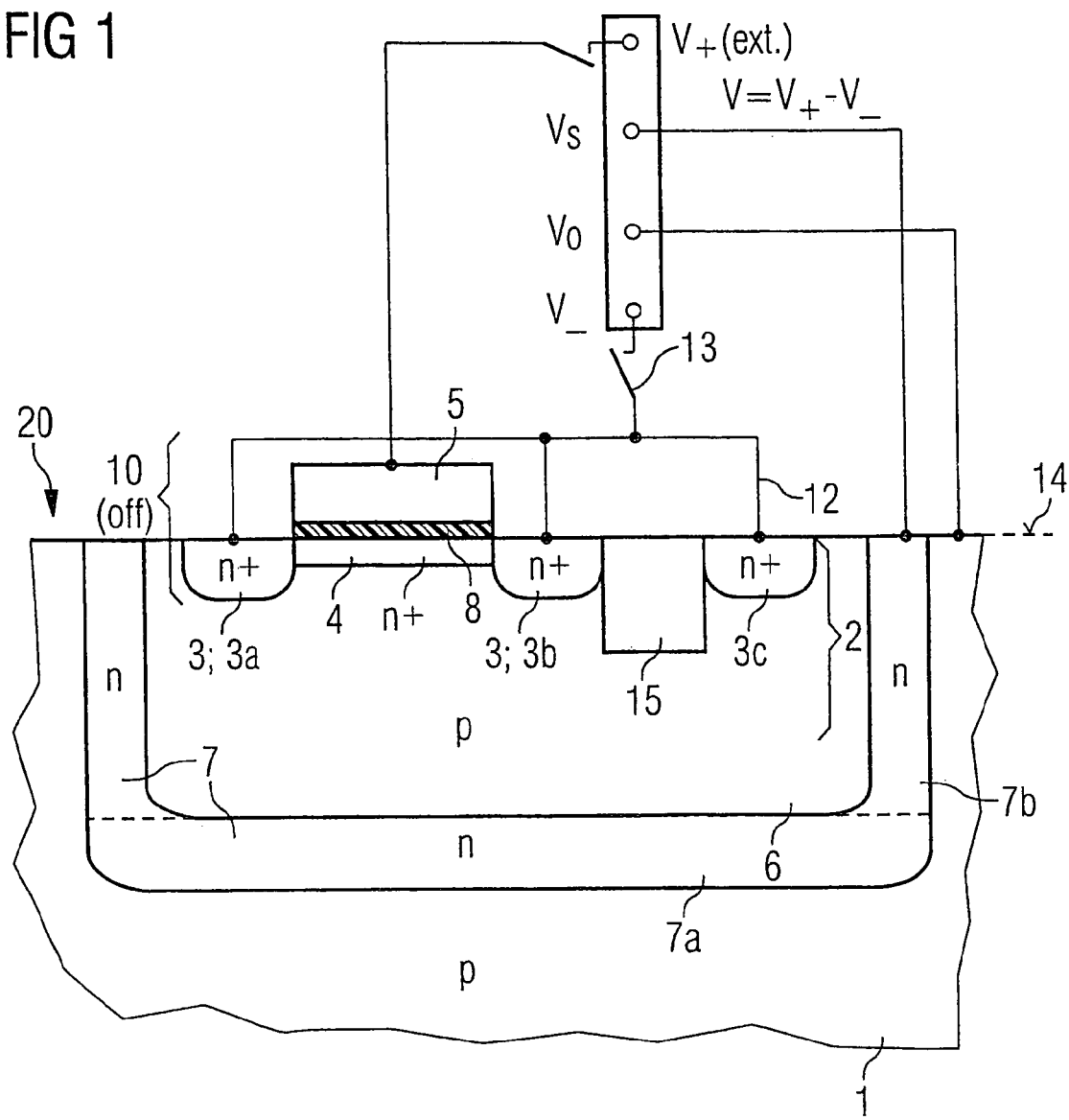
FIG. 1 shows an embodiment of the inventive semiconductor memory in the state prior to programming of the switching element.

In FIG. 1, the current barrier layer 7 is an n-doped layer arranged between the p-substrate 1 and the weakly doped p-region 6 of the substrate electrode 2. It is connected permanently or at least during a programming operation to a blocking potential $V_s$ which is higher than the substrate potential $V_o$, in order to decouple the potential on the substrate electrode 2 from that on the surrounding semiconductor substrate 1 by means of a pn-junction connected upstream in the reverse direction. This makes it possible to lower the potential $V_-$ on the substrate electrode 2 below the substrate potential $V_o$ too and, as a result, to increase the programming voltage V for the first time without destroying other components of the semiconductor circuit 20, which are not shown diagrammatically in FIG. 1. Particularly memory areas or memory cells in the semiconductor memory 20 and also their supply lines, that is to say word lines or bit lines, are not loaded with a higher potential than that of the conventional operating voltage Vdd in the case of the inventive semiconductor memory shown in FIG. 1. The positive programming potential $V_+$ which can be connected to the opposing electrode 5, and which is provided by an external voltage source, does not need to be altered; instead, the inventive lowering of the potential $V_-$ on the substrate electrode 6 ensures an increase in the programming voltage without adversely affecting other circuit regions and without feedback to the substrate potential $V_o$. Preferably, the substrate potential is 0 V.

From the point of view of production, the well 7 shown in FIG. 1 can be produced by means of two implantations which respectively form a buried layer 7a and side insulations 7b. Alternatively, the larger n-well 7 can subsequently be redoped by means of a smaller well 6 for the substrate electrode 2.

Figure 2:
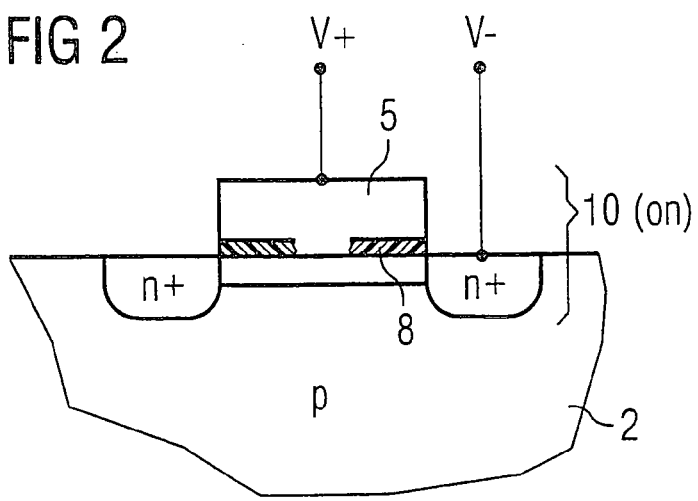
FIG. 2 shows a detail from FIG. 1 in the state after programming of the switching element.

The switching element 10 in FIG. 1 has not yet been programmed, i.e. has not yet been destroyed. FIG. 2 shows a detail from FIG. 1 in which the gate oxide layer 8 has been destroyed locally, resulting in a conductive connection between the gate electrode 5 and the substrate electrode 2. The switching element shown is therefore an antifuse. The antifuse is permanently conductive after programming, i.e. is in the on state.

Figure 3:
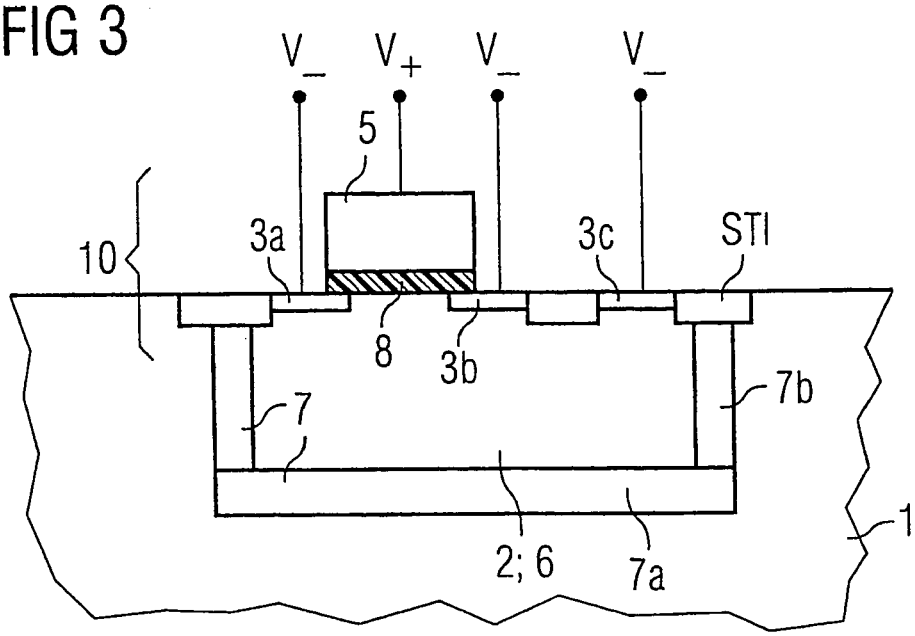
FIG. 3 shows another embodiment of a semiconductor memory based on the invention.

FIG. 3 shows an alternative embodiment of the inventive semiconductor memory in which, unlike in FIG. 1, the current barrier layer 7 comprises an insulating layer or a plurality of insulating layers. Again, the side insulations 7b may be produced laterally offset with respect to the substrate electrode 2 in a separate method step from a further method step for introducing a buried layer 7a beneath the substrate electrode. The electrical driving of the switching element 10 in FIG. 3 takes place as in FIG. 1, apart from that in this case there is no need for any dedicated potential for the current barrier layer 7; this is inherently insulating as an insulating layer and can be produced within the context of shallow trench isolation production, for example.

Figure 4:
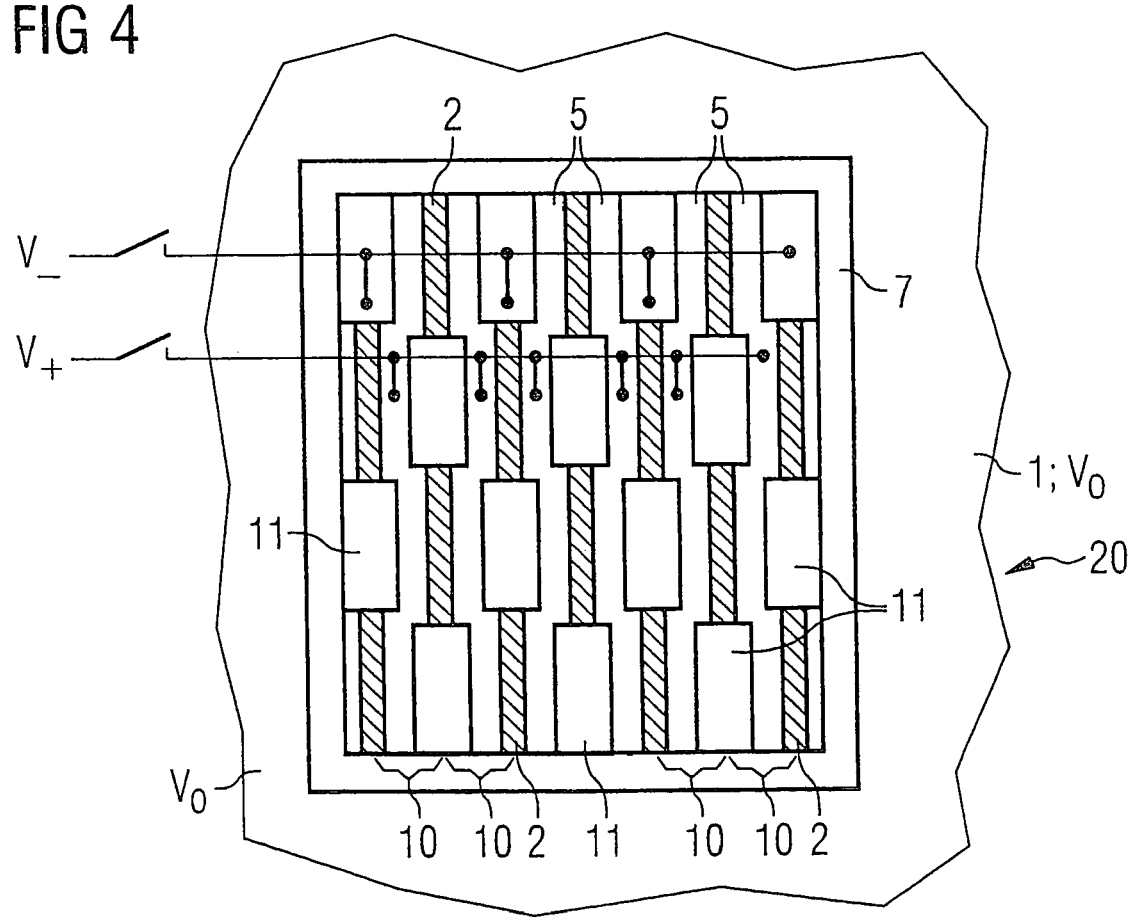
FIG. 4 shows a development of the inventive semiconductor memory with a multiplicity of antifuse structures connected in parallel with one another.

FIG. 4 shows a plan view of a schematic illustration of a development of a semiconductor memory based on the invention, in which a multiplicity of antifuse structures are arranged within a single surrounding current barrier layer. The current barrier layer 7 contains word lines 5 structured in a zigzag shape, i.e. running with a lateral offset in places, which form the gate electrodes. All of the gate electrodes are shorted to one another and can be connected to an external programming potential $V_+$. In the same way, contacts 11 which make contact with the substrate electrodes are shorted to one another and can be connected to a negative potential $V_-$ generated inside the circuit. This results in a multiplicity of parallel-connected antifuses or switching elements 10, which significantly increase the probability of a successful programming operation. Further modifications of the inventive semiconductor memory are obtained upon application of the knowledge and capabilities of a person skilled in the art.

LIST OF REFERENCE SYMBOLS

1 Substrate
2 Substrate electrode
3; 3a, 3b Source/drain implantation
3c Further highly doped implantation
4 Channel implantation
5 Opposing electrode (gate electrode)
6 Weakly doped substrate region
7 Current barrier layer
8 Insulating layer (gate oxide layer)
10 Switching element (antifuse)
11 Contact
12 Circuit
13 Switch
14 Substrate surface
V Programming voltage
$V_+$ First electrical potential
$V_-$ Second electrical potential
$V_o$ Substrate potential
$V_s$ Blocking potential
STI Trench insulation

The invention claimed is:

1. An integrated semiconductor circuit having an electrically programmable switching element, which can be switched once from an electrically insulating state into an electrically conductive state by applying a programming voltage,
where the switching element has a substrate electrode, produced in a substrate, which can be electrically biased with a substrate potential, and an opposing electrode, which is isolated from the substrate electrode by an insulating layer,
where the substrate electrode comprises at least one highly doped substrate region, and
where the opposing electrode can be connected to an external first electrical potential, which can be provided outside of the semiconductor circuit,
wherein
the substrate electrode can be connected, for the purpose of programming the switching element, to a second electrical potential, which is provided by the semiconductor circuit, and which, together with the external first potential, provides a higher programming voltage than the external first potential together with the substrate potential, wherein said insulating layer is damaged by said higher programming voltage such that an electrical connection exists between said substrate electrode and said opposing electrode after said programming, and wherein the substrate electrode is shielded from the substrate potential by a current barrier layer, which when the switching element is programmed, prevents a flow of current between the substrate electrode and a region of the substrate, which has been biased with the substrate potential.

2. The semiconductor circuit as claimed in claim 1, wherein the current barrier layer is a doped intermediate layer which has the opposite doping from that of the substrate, which surrounds the intermediate layer.

3. The semiconductor circuit as claimed in claim 2, wherein the substrate electrode comprises a weakly doped substrate region, which surrounds the highly doped substrate region, and which has the opposite doping from that of the current barrier layer.

4. The semiconductor circuit as claimed in claim 1, wherein the current barrier layer can be connected to a blocking potential for the purpose of programming the switching element, which results in reverse biased pn-junctions between the current barrier layer and the substrate and between the current barrier layer and the substrate electrode.

5. The semiconductor circuit as claimed in claim 1, wherein the highly doped substrate region of the substrate electrode and the current barrier layer are n-doped, wherein a region of the substrate, which can be biased with the substrate potential and the weakly doped substrate region are p-doped, and wherein the blocking potential is higher than the substrate potential.

6. The semiconductor circuit as claimed in claim 1, wherein the current barrier layer is an electrical insulating layer.

7. The semiconductor circuit as claimed in claim 1, wherein the current barrier layer comprises a buried layer beneath the wealdy doped substrate region and comprises side insulations, which surround the switching element at the sides and extend as far as the buried layer.

8. The semiconductor circuit as claimed in claim 1, wherein the opposing electrode is a gate electrode, which is isolated from the substrate electrode by a gate oxide layer.

9. The semiconductor circuit as claimed in claim 8, wherein the highly doped substrate region of the substrate electrode comprises two source/drain implantations, which are shorted to one another.

10. The semiconductor circuit as claimed in claim 9, wherein a channel doping of the same doping type as the doping type of the source/drain implantations is introduced into the substrate between the two source/drain implantations.

11. The semiconductor circuit as claimed in claim 1, wherein the semiconductor circuit has a plurality of switching elements, which are shielded from a substrate region which can be biased with the substrate potential by a common current barrier layer, and whose substrate electrodes are shorted to one another, and whose opposing electrodes are shorted to one another.

12. The semiconductor circuit as claimed in claim 1, wherein the semiconductor circuit is a memory circuit, preferably a memory circuit in a dynamic read/write memory.

13. The semiconductor circuit as claimed in claim 1, wherein the programmable switch element comprises an antifuse.

14. A circuit having an electrically programmable element for switching from an electrically insulating state to an electrically conductive state comprising:

a semiconductor substrate having a first doping, said substrate connected to a substrate potential;

a well defined in said substrate, said well having a second doping;

a current barrier layer, having a third doping, formed between said substrate and said well;

a substrate electrode defined in said well;

a first terminal connected to said well and said substrate electrode;

a well potential or voltage for selectively connecting to said first terminal, said well potential less than said substrate potential;

an opposing electrode connected to a second terminal;

a programming potential for connecting to said second terminal, said programming potential greater than said substrate potential; and an insulating layer between said substrate electrode and said opposing electrode, said insulating layer made of a material that is damaged when said well voltage is connected to said first terminal at the same time said programming voltage is connected to said second terminal such that said damaged insulating layer provides an electrical connection between said substrate electrode and said opposing electrode.

15. The circuit of claim 14, wherein the current barrier layer is a doped intermediate layer which has the opposite doping from that of the substrate, which surrounds the intermediate layer.

16. The circuit of claim 14, wherein the substrate electrode comprises a weakly doped substrate region, which surrounds the highly doped substrate region, and which has the opposite doping from that of the current barrier layer.

17. The circuit of claim 14, wherein the current barrier layer is connected to a blocking potential during the programming of said element, said blocking potential creating a reverse biased pn-junction between the current barrier layer and the substrate and between the current barrier layer and the substrate electrode.

18. The circuit of claim 14, wherein the substrate electrode is highly doped and comprises two source/drain implantations, which are shorted to each other.

19. The circuit of claim 14, wherein said circuit is a memory circuit in a dynamic read/write memory.

20. The circuit of claim 17, wherein the substrate electrode and the current barrier layer are n-doped, the substrate and the well region are p-doped and wherein the blocking potential is higher than the substrate potential.

* * * * *

UNITED STATES PATENT AND TRADEMARK OFFICE
CERTIFICATE OF CORRECTION

| | |
|---|---|
| PATENT NO. | : 7,126,204 B2 |
| APPLICATION NO. | : 10/886017 |
| DATED | : October 24, 2006 |
| INVENTOR(S) | : Frey et al. |

Page 1 of 1

It is certified that error appears in the above-identified patent and that said Letters Patent is hereby corrected as shown below:

Column 8, line 36: delete "wealdy" insert --weakly--

Signed and Sealed this

Ninth Day of January, 2007

JON W. DUDAS
*Director of the United States Patent and Trademark Office*